(12) United States Patent
Jang et al.

(10) Patent No.: US 10,741,628 B2
(45) Date of Patent: Aug. 11, 2020

(54) PRINTED CIRCUIT BOARDS INCLUDING DRIVE CIRCUITS, AND RELATED SEMICONDUCTOR DEVICES

(71) Applicant: Samsung Electronics Co., Ltd., Suwon-si, Gyeonggi-do (KR)

(72) Inventors: Minhwa Jang, Hwaseong-si (KR); Jungeun Koo, Hwaseong-si (KR); Yechung Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 125 days.

(21) Appl. No.: 15/653,117

(22) Filed: Jul. 18, 2017

(65) Prior Publication Data

US 2018/0026089 A1  Jan. 25, 2018

Related U.S. Application Data

(60) Provisional application No. 62/366,357, filed on Jul. 25, 2016.

(30) Foreign Application Priority Data

Oct. 17, 2016  (KR) .......................... 10-2016-0134491

(51) Int. Cl.
| | | |
|---|---|---|
| *H01L 27/32* | (2006.01) | |
| *G09G 3/20* | (2006.01) | |
| *G09G 3/3225* | (2016.01) | |
| *H01L 51/00* | (2006.01) | |

(52) U.S. Cl.
CPC ........... *H01L 27/3276* (2013.01); *G09G 3/20* (2013.01); *G09G 3/3225* (2013.01); *H01L 51/0097* (2013.01); *G09G 2300/0426* (2013.01); *G09G 2310/0221* (2013.01); *G09G 2310/08* (2013.01); *G09G 2370/08* (2013.01)

(58) Field of Classification Search
CPC ... H01L 27/3276; H01L 51/0097; G09G 3/20; G09G 3/3225; G09G 2310/0221
USPC .............................. 257/40; 349/33; 345/206
See application file for complete search history.

(56) References Cited

U.S. PATENT DOCUMENTS

| | | | |
|---|---|---|---|
| 7,746,315 B2 | 6/2010 | Li et al. | |
| 7,956,836 B2 | 6/2011 | Yamazaki | |
| 8,514,162 B2 | 8/2013 | Moh et al. | |
| 9,349,683 B2 | 5/2016 | Jung et al. | |
| 2011/0285679 A1* | 11/2011 | Oh | G02F 1/136277 345/206 |
| 2015/0219947 A1* | 8/2015 | Moh | G02F 1/13452 349/33 |
| 2016/0133550 A1 | 5/2016 | Chen | |
| 2016/0148599 A1 | 5/2016 | Lim et al. | |

FOREIGN PATENT DOCUMENTS

| | | |
|---|---|---|
| JP | 4602385 B2 | 12/2010 |
| KR | 10-1633103 B1 | 6/2016 |

* cited by examiner

*Primary Examiner* — Bo Fan
(74) *Attorney, Agent, or Firm* — Myers Bigel, P.A.

(57) ABSTRACT

Semiconductor devices are provided. A semiconductor device includes a substrate, a controller on the substrate, first and second drive circuits on the substrate, and a plurality of signal lines on the substrate that connect the controller to the first and second drive circuits. The plurality of signal lines are each at the same vertical level and are horizontally spaced apart from each other. Related printed circuit boards are also provided.

20 Claims, 7 Drawing Sheets

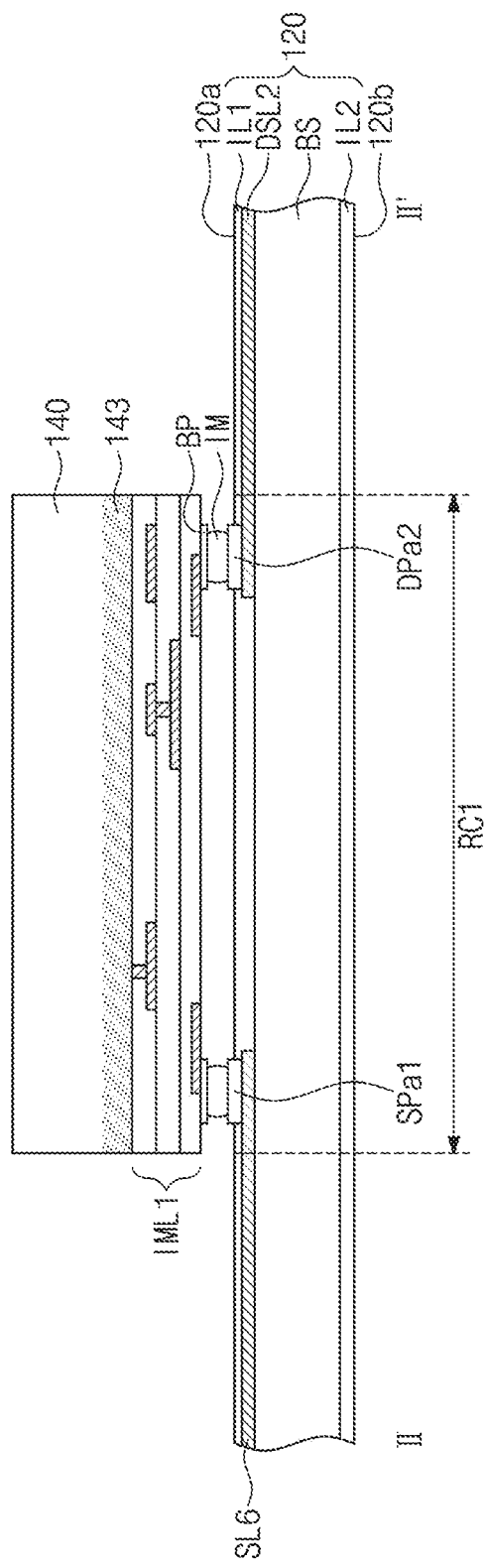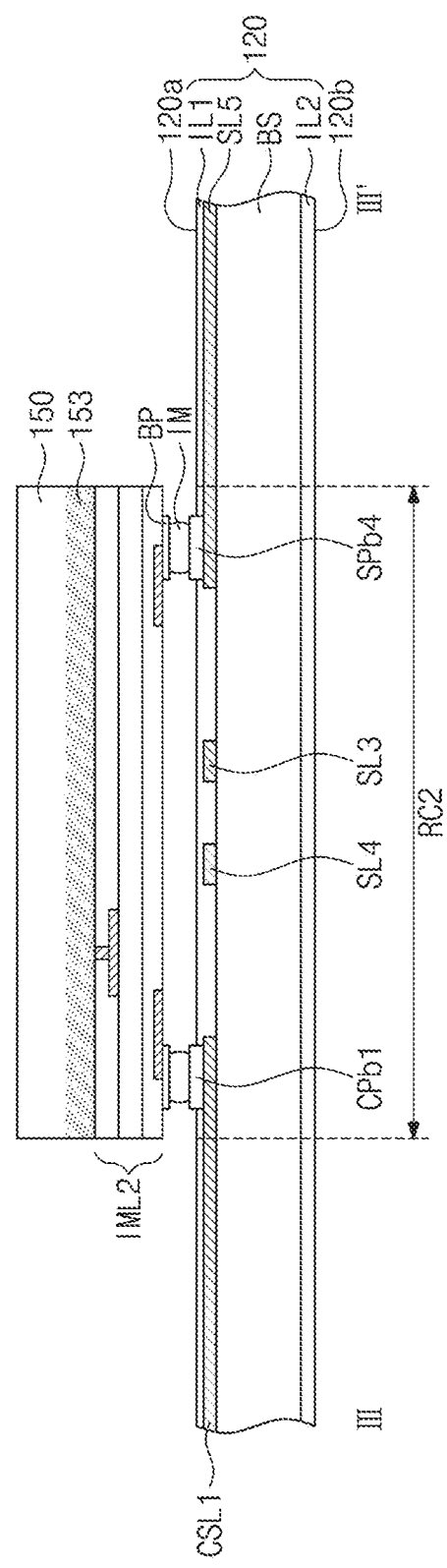

PRINTED CIRCUIT BOARDS INCLUDING DRIVE CIRCUITS, AND RELATED SEMICONDUCTOR DEVICES

CROSS-REFERENCE TO RELATED APPLICATIONS

This U.S. non-provisional patent application claims the benefit of U.S. provisional Patent Application No. 62/366,357, filed on Jul. 25, 2016, and priority under 35 U.S.C § 119 to Korean Patent Application No. 10-2016-0134491, filed on Oct. 17, 2016, entire contents of which applications are hereby incorporated by reference herein.

BACKGROUND

The present disclosure relates to a printed circuit board and a semiconductor device including the same, which may be used, for example, with a display apparatus. A display system may include a display apparatus for displaying images and a host for outputting a plurality of control signals and image data of each frame. The display apparatus includes a display panel for displaying images, and gate and data drive units for driving the display panel. The display panel includes a plurality of gate lines, a plurality of data lines, and a plurality of pixels connected to the gate and data lines. The gate lines receive gate signals from the gate drive unit. The data lines receive data signals from the data drive unit. The pixels receive the data signals through the data lines in response to the gate signals provided through the gate lines. The pixels display gray scale corresponding to data voltages. Images are then displayed.

The display system may use a semiconductor device, which may be beneficial in the electronics industry because of its small size, multi-function, and/or low fabrication cost. Semiconductor devices may be categorized as semiconductor memory devices storing logic data, semiconductor logic devices processing operations of logic data, and hybrid semiconductor devices having both memory and logic elements. Semiconductor devices have been increasingly used for high integration with the advanced development of the electronics industry. For example, a semiconductor device has been increasingly requested for high reliability, high speed, and/or multi-function. A semiconductor device may be complex and highly integrated to meet these requested characteristics.

SUMMARY

Various embodiments of present inventive concepts provide printed circuit boards, and semiconductor devices including the same, having a single routing layer.

A semiconductor device, according to various embodiments herein, may include a base substrate. The semiconductor device may include a timing controller chip on the base substrate. The semiconductor device may include first and second drive circuit chips on the base substrate. Moreover, the semiconductor device may include a plurality of signal lines on the base substrate. The plurality of signal lines may be positioned at a same vertical level and may be horizontally spaced apart from each other. The plurality of signal lines may include a first data signal line and a first control signal line that electrically connect the timing controller chip with the first drive circuit chip. The plurality of signal lines may also include a second data signal line and a second control signal line that electrically connect the timing controller chip with the second drive circuit chip.

A printed circuit board, according to various embodiments herein, may include a base substrate including a first region including a timing controller chip, a second region including a first drive circuit chip, and a third region including a second drive circuit chip. The printed circuit board may include a first data signal pad, a second data signal pad, a first control signal pad, and a second control signal pad that are on the first region. The printed circuit board may include a data signal pad and a control signal pad that are on the second region. The printed circuit board may include a data signal pad and a control signal pad that are on the third region. The printed circuit board may include a first data signal line that connects the first data signal pad of the first region to the data signal pad of the second region. The printed circuit board may include a first control signal line that connects the first control signal pad of the first region to the control signal pad of the second region. The printed circuit board may include a second data signal line that connects the second data signal pad of the first region to the data signal pad of the third region. Moreover, the printed circuit board may include a second control signal line that connects the second control signal pad of the first region to the control signal pad of the third region. The first and second data signal lines and the first and second control signal lines may be at a same vertical level and may be horizontally spaced apart from each other.

A semiconductor device, according to various embodiments herein, may include a controller. The semiconductor device may include first and second drive circuits that are configured to drive a display panel and are connected to the controller by first and second pluralities of signal lines, respectively. Moreover, the semiconductor device may include a film that includes thereon the first and second pluralities of signal lines, the controller, and the first and second drive circuits. Each of the first plurality of signal lines and each of the second plurality of signal lines may be in a single layer of non-overlapping signal lines on the film, such that the first and second pluralities of signal lines are non-overlapping on the film.

BRIEF DESCRIPTION OF THE DRAWINGS

FIG. 4 is a cross-sectional view taken along line II-IF of FIG. 3.

FIG. 5 is a cross-sectional view taken along line of FIG. 3.

DETAILED DESCRIPTION

Figure 1:
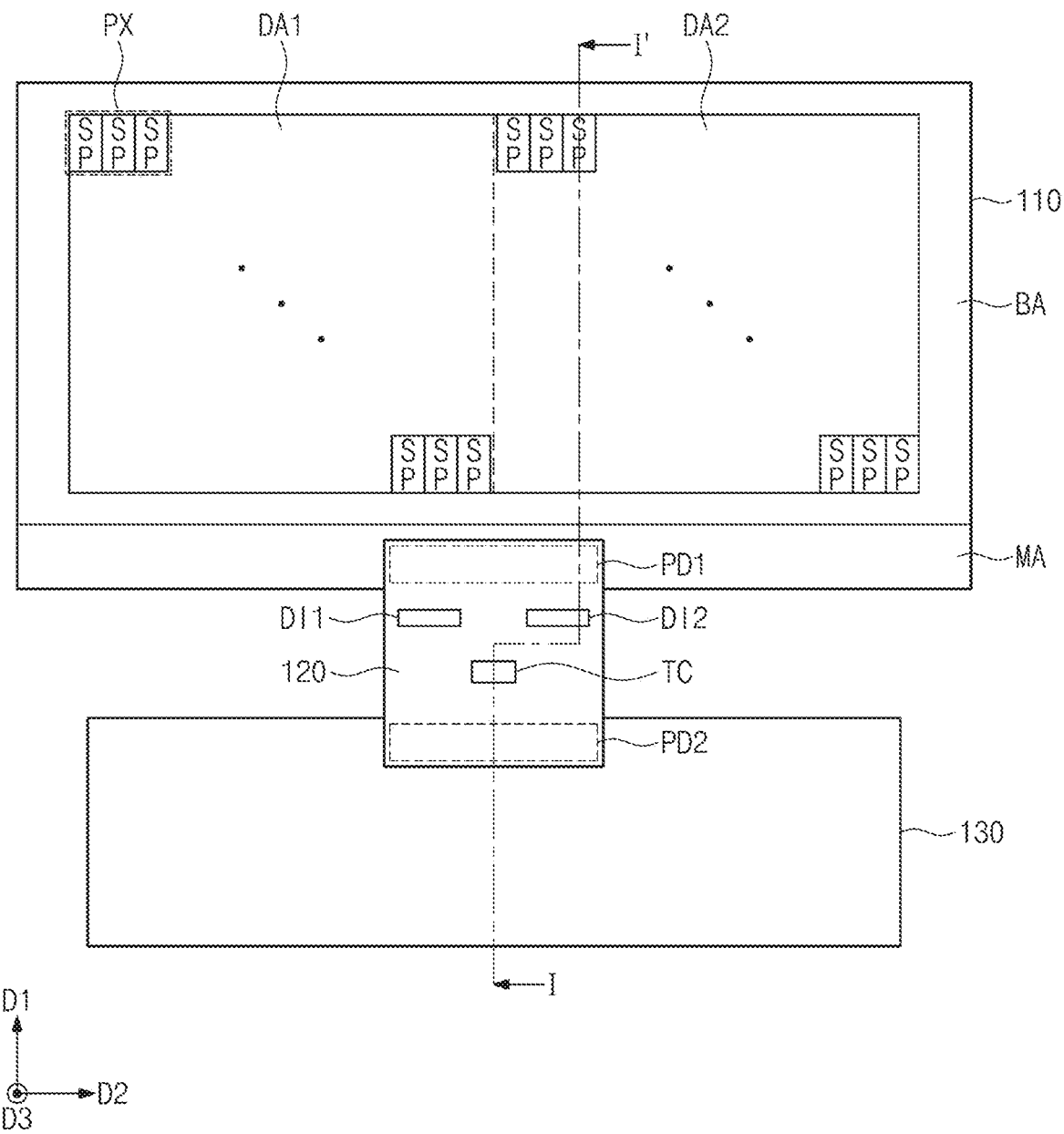
FIG. 1 is a plan view illustrating a display apparatus according to example embodiments of present inventive concepts.
Figure 2:
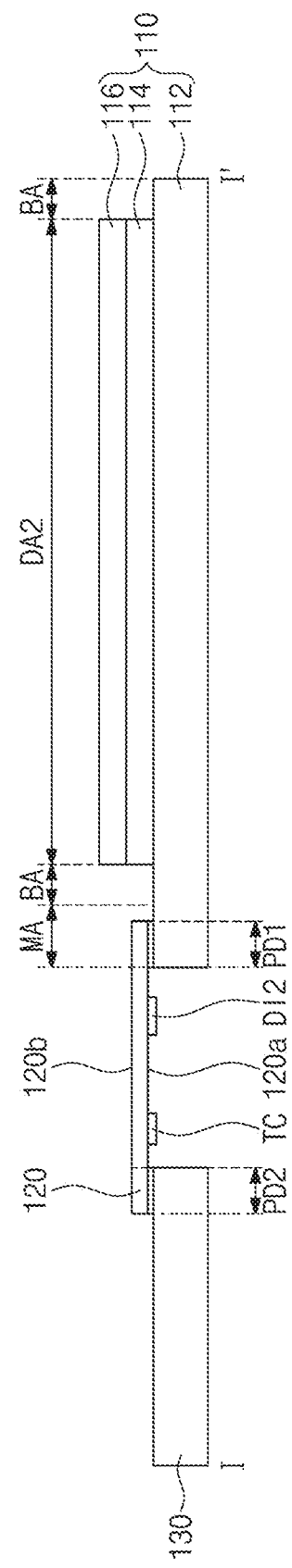
FIG. 2 is a cross-sectional view taken along line I-I' of FIG. 1.

FIG. 1 is a plan view illustrating a display apparatus according to example embodiments of present inventive concepts, and FIG. 2 is a cross-sectional view taken along line I-I' of FIG. 1.

Referring to FIGS. 1 and 2, a display panel 110, a flexible printed circuit board 120, and a main drive substrate 130 may be included in a display apparatus according to example embodiments of present inventive concepts. The flexible printed circuit board 120 may be disposed between, and may electrically connect, the display panel 110 and the main drive substrate 130.

The display panel 110 may display images when drive signals are applied to a plurality of pixels PX. Each of the pixels PX may include sub-pixels SP. For example, three sub-pixels SP may constitute one pixel PX. In other examples, one pixel PX may include two, four, or more than four sub-pixels SP.

The sub-pixels SP may be arranged in a matrix form along first and second directions D1 and D2 crossing each other. The sub-pixels SP may display at least one of primary colors such as red, green, and blue. The colors displayed by the sub-pixels SP are not limited to red, green, and blue. Rather, the sub-pixels SP may display various colors, for example, secondary primary colors such as white, yellow, cyan, and magenta in addition to, or instead of, red, green, and blue.

In accordance with a kind (i.e., type) of pixel PX, the display panel 110 may be classified as a liquid crystal display panel, an organic light emitting display panel, an electro-wetting display panel, and so on. For example, in some embodiments, the display panel 110 may be an organic light emitting display panel.

The display panel 110 may include a first display area DA1 where a plurality of the pixels PX are disposed and a second display area DA2 where another plurality of the pixels PX are disposed. The first and second display areas DA1 and DA2 may be linearly arranged in the second direction D2. The display panel 110 may further include a non-display area BA, which surrounds the first and second display areas DA1 and DA2, and a mount area MA, which is coupled to the flexible printed circuit board 120. In some embodiments, the non-display area BA may be omitted. Moreover, in some embodiments, the mount area MA may be a portion of the non-display area BA.

As shown in FIG. 2, the display panel 110 may include a display substrate 112, a display apparatus layer 114 on the display substrate 112, and a sealing layer 116 on the display apparatus layer 114. The display substrate 112 may include an insulation layer, a functional layer, and a conductive layer on a substrate. The conductive layer may include gate lines, data lines, and other signal lines.

The display apparatus layer 114 may include an insulation layer, a functional layer, and a conductive layer that constitute a plurality of the pixels PX. The functional layer of the display apparatus layer 114 may include an organic light emitting layer. The sealing layer 116 may be disposed on and protect the display apparatus layer 114. In some embodiments, the sealing layer 116 may also optionally cover a side of the display apparatus layer 114.

The non-display area BA may include thereon a black matrix that blocks light. The non-display area BA may include thereon a gate drive circuit for supplying a plurality of the pixels PX with gate signals. The mount area MA may include thereon a pad region for receiving a signal provided from the flexible printed circuit board 120.

The flexible printed circuit board 120 may have two facing (i.e., opposing) sides extending in the first direction D1 and another two facing/opposing sides extending in the second direction D2. The flexible printed circuit board 120 may include a first surface 120a and a second surface 120b facing/opposing the first surface 120a. The flexible printed circuit board 120 may include a first pad region PD1 and a second pad region PD2. The first pad region PD1 may be connected to the pad region of the mount area MA, and the second pad region PD2 may be connected to a pad region of the main drive substrate 130.

A timing controller chip TC, a first drive circuit chip DI1, and a second drive circuit chip DI2 may be mounted on the first surface 120a of the flexible printed circuit board 120. In some embodiments, a chip-on-film structure may be constituted/provided by the flexible printed circuit board 120 and its attached timing controller chip TC, first drive circuit chip DI1, and second drive circuit chip DI2. The timing controller chip TC, the first drive circuit chip DI1, and the second drive circuit chip DI2 may be electrically connected to each other through signal lines at an upper portion of the flexible printed circuit board 120.

Each of the first and second drive circuit chips DI1 and DI2 may include a data drive circuit. The first drive circuit chip DI1 may transform a drive signal output from the timing controller chip TC into a data voltage, and the pixels PX of the first display area DA1 may receive the data voltage from the first drive circuit chip DI1. The second drive circuit chip DI2 may transform a drive signal output from the timing controller chip TC into a data voltage, and the pixels PX of the second display area DA2 may receive the data voltage from the second drive circuit chip DI2.

The main drive substrate 130 may include a pad region connected to the second pad region PD2 of the flexible printed circuit board 120. The main drive substrate 130 may provide the display panel 110 or the flexible printed circuit board 120 with image data, control signal(s), power voltage(s), and so on. The main drive substrate 130 may include an active component and a passive component.

Figure 3:
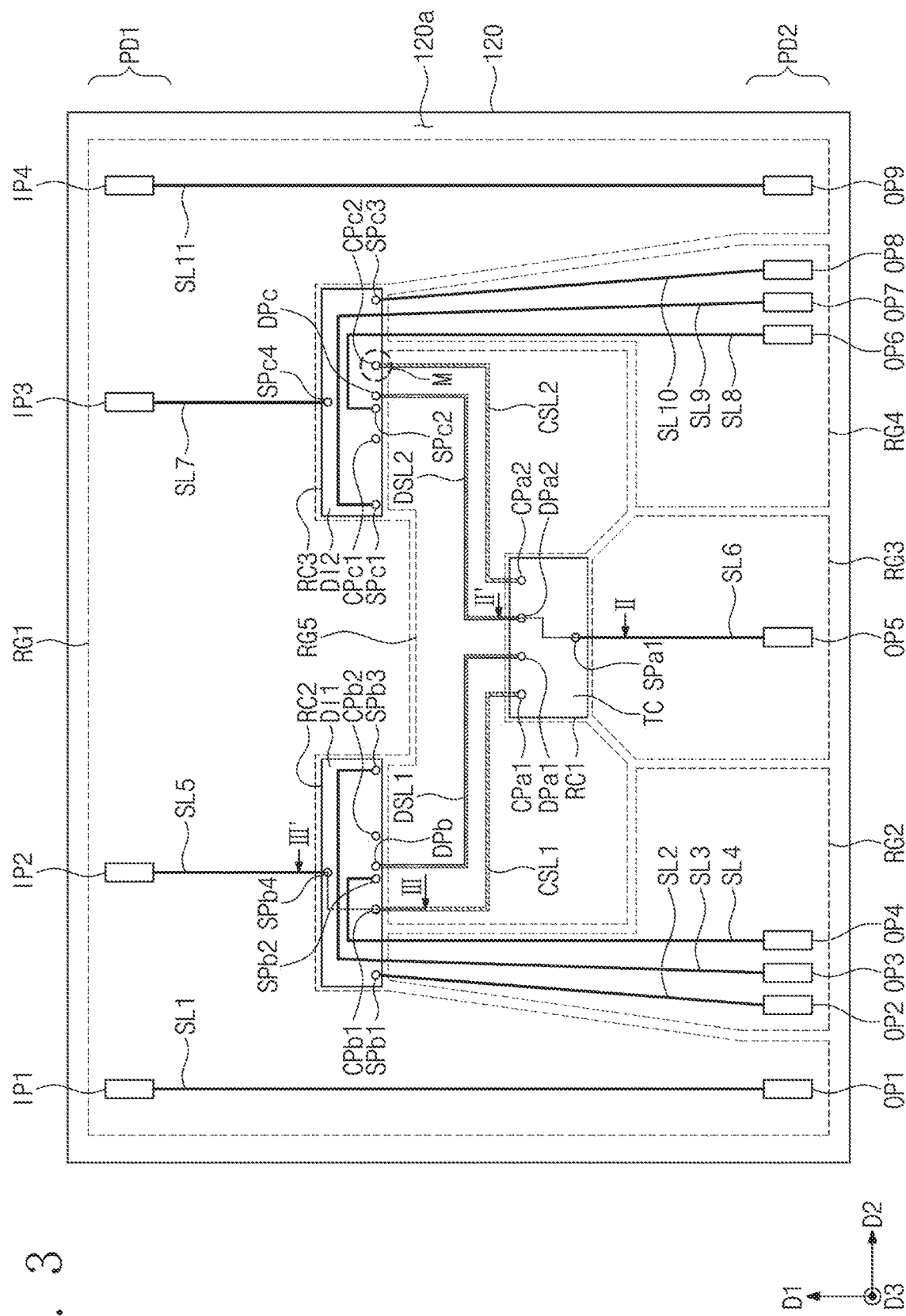
FIG. 3 is a plan view illustrating a timing controller chip, a first drive circuit chip, and a second drive circuit chip mounted on a flexible printed circuit board according to example embodiments of present inventive concepts.

FIG. 3 is a plan view illustrating a timing controller chip, a first drive circuit chip, and a second drive circuit chip mounted on a flexible printed circuit board according to example embodiments of present inventive concepts. FIG. 4 is a cross-sectional view taken along line II-II' of FIG. 3. FIG. 5 is a cross-sectional view taken along line III-III' of FIG. 3.

Referring to FIGS. 3, 4, and 5, the timing controller chip TC, the first drive circuit chip DI1, and the second drive circuit chip DI2 may be mounted on the first surface 120a of the flexible printed circuit board 120. In some embodiments, the first and second drive circuit chips DI1 and DI2 may be the same chip. Each of the first and second drive circuit chips DI1 and DI2 may be spaced apart from the timing controller chip TC in the first direction D1. The first and second drive circuit chips DI1 and DI2 may be spaced apart from each other in the second direction D2. The first and second drive circuit chips DI1 and DI2 may be adjacent to the first pad region PD1, and the timing controller chip TC may be adjacent to the second pad region PD2.

The flexible printed circuit board 120 may include a first chip region RC1 where the timing controller chip TC is positioned, a second chip region RC2 where the first drive circuit chip DI1 is positioned, and a third chip region RC3 where the second drive circuit chip DI2 is positioned. The flexible printed circuit board 120 may further include first to fifth regions RG1 to RG5. The first to fifth regions RG1 to RG5 may not overlap the first to third chip regions RC1 to RC3.

The second region RG2 may extend from the second pad region PD2 toward the second chip region RC2. The third region RG3 may extend from the second pad region PD2 toward the first chip region RC1. The third region RG3 may be interposed between the second and fourth regions RG2 and RG4. The fourth region RG4 may extend from the second pad region PD2 toward the third chip region RC3. The fifth region RG5 may be interposed between the first to third chip regions RC1 to RC3. That is, the fifth region RG5 may extend in the first and second directions D1 and D2 between the first to third chip regions RC1 to RC3. In addition, the fifth region RG5 may be interposed between the second and fourth regions RG2 and RG4. The first region RG1 may be a remaining region outside of the second to fifth regions RG2 to RG5.

First to fourth input pads IP1 to IP4 may be disposed on the first surface 120a of the first pad region PD1. First to ninth output pads OP1 to OP9 may be disposed on the first surface 120a of the second pad region PD2. The first to ninth output pads OP1 to OP9 may receive output signals from the main drive substrate 130 discussed with reference to FIGS. 1 and 2, and the first to fourth input pads IP1 to IP4 may input signals to the display panel 110 discussed with reference to FIGS. 1 and 2.

The first region RG1 may include the first to fourth input pads IP1 to IP4 and the first and ninth output pads OP1 and OP9 thereon. The second region RG2 may include the second to fourth output pads OP2 to OP4 thereon. The third region RG3 may include the fifth output pad OP5 thereon. The fourth region RG4 may include the sixth to eighth output pads OP6 to OP8 thereon.

The first surface 120a of the first chip region RC1 may include a first control signal pad CPa1, a second control signal pad CPa2, a first data signal pad DPa1, a second data signal pad DPa2, and a signal pad SPa1 thereon. The first and second control signal pads CPa1 and CPa2 and the first and second data signal pads DPa1 and DPa2 may be arranged in the second direction D2. The first and second data signal pads DPa1 and DPa2 may be positioned between the first and second control signal pads CPa1 and CPa2.

The first surface 120a of the second chip region RC2 may include a first control signal pad CPb1, a second control signal pad CPb2, a data signal pad DPb, and first to fourth signal pads SPb1 to SPb4 thereon. The first and second control signal pads CPb1 and CPb2, the data signal pad DPb, and the first to third signal pads SPb1 to SPb3 may be arranged in the second direction D2. The second signal pad SPb2 and the data signal pad DPb may be positioned between the first and second control signal pads CPb1 and CPb2. The second chip region RC2 may have a first side and a second side that face (i.e., oppose) each other and extend in the first direction D1. The first signal pad SPb1 may be adjacent to the first side, and the third signal pad SPb3 may be adjacent to the second side.

The first surface 120a of the third chip region RC3 may include a first control signal pad CPc1, a second control signal pad CPc2, a data signal pad DPc, and first to fourth signal pads SPc1 to SPc4 thereon. The first and second control signal pads CPc1 and CPc2, the data signal pad DPc, and the first to fourth signal pads SPc1 to SPc4 of the third chip region RC3 may be the same as the first and second control signal pads CPb1 and CPb2, the data signal pad DPb, and the first to fourth signal pads SPb1 to SPb4 of the second chip region RC2. In more detail, positions of the first and second control signal pads CPc1 and CPc2, the data signal pad DPc, and the first to fourth signal pads SPc1 to SPc4 of the third chip region RC3 may be the same as those of the first and second control signal pads CPb1 and CPb2, the data signal pad DPb, and the first to fourth signal pads SPb1 to SPb4 of the second chip region RC2. This may be because that the first drive circuit chip DI1 mounted on the second chip region RC2 is the same as (i.e., a duplicate of) the second drive circuit chip DI2 mounted on the third chip region RC3.

The first surface 120a of the first region RG1 may include thereon first, fifth, seventh, and eleventh signal lines SL1, SL5, SL7, and SL11. The first signal line SL1 may connect the first output pad OP1 with the first input pad IP1. The fifth signal line SL5 may connect the second input pad IP2 with the fourth signal pad SPb4 of the second chip region RC2. The seventh signal line SL7 may connect the third input pad IP3 with the fourth signal pad SPc4 of the third chip region RC3. The eleventh signal line SL11 may connect the ninth output pad OP9 with the fourth input pad IP4.

The first surface 120a of the second region RG2 may include second, third, and fourth signal lines SL2, SL3, and SL4 thereon. The second signal line SL2 may connect the second output pad OP2 with the first signal pad SPb1 of the second chip region RC2. The third signal line SL3 may connect the third output pad OP3 with the third signal pad SPb3 of the second chip region RC2. The fourth signal line SL4 may connect the fourth output pad OP4 with the second signal pad SPb2 of the second chip region RC2. Each of the third and fourth signal lines SL3 and SL4 may include a portion extending in the second direction D2 on the second chip region RC2. Accordingly, the third signal line SL3 may be connected through its extending portion to the third signal pad SPb3 adjacent to the fifth region RG5. Likewise, the fourth signal line SL4 may be connected through its extending portion to the second signal pad SPb2 adjacent to the fifth region RG5.

The first surface 120a of the third region RG3 may include a sixth signal line SL6 thereon. The sixth signal line SL6 may connect the fifth output pad OP5 with the signal pad SPa1 of the first chip region RC1.

The first surface 120a of the fourth region RG4 may include eighth, ninth, and tenth signal lines SL8, SL9, and SL10 thereon. The eighth signal line SL8 may connect the sixth output pad OP6 with the second signal pad SPc2 of the third chip region RC3. The ninth signal line SL9 may connect the seventh output pad OP7 with the first signal pad SPc1 of the third chip region RC3. The tenth signal line SL10 may connect the eighth output pad OP8 with the third signal pad SPc3 of the third chip region RC3.

A signal applied to the eighth signal line SL8 may be the same as, or the same kind/type as, that applied to the fourth signal line SL4. A signal applied to the ninth signal line SL9 may be the same as, or the same kind/type as, that applied to the second signal line SL2. A signal applied to the tenth signal line SL10 may be the same as, or the same kind/type as, that applied to the third signal line SL3. In other words, signals applied to the first signal pads SPb1 and SPc1 may be the same or the same kind/type, signals applied to the second signal pads SPb2 and SPc2 may be the same or the same kind/type, and signals applied to the third signal pads SPb3 and SPc3 may be the same or the same kind/type. As such, the same (i.e., identical/duplicate) first and second drive circuit chips DI1 and DI2 may be mounted on the second and third chip regions RC2 and RC3, respectively.

Various kinds/types of signals may be transmitted through the first to eleventh signal lines SL1 to SL11. The kind/type of signal transmitted is not particularly limited thereto. In detail, the first to fourth, sixth, and eighth to eleventh signal lines SL1 to SL4, SL6, and SL8 to SL11 may be provided with system signals output from the main drive substrate 130 discussed with reference to FIGS. 1 and 2. The fifth and seventh signal lines SL5 and SL7 may be provided with signals output from the first and second drive circuit chips DI1 and DI2, respectively.

The first surface 120a of the fifth region RG5 may include a first control signal line CSL1, a second control signal line CSL2, a first data signal line DSL1, and a second data signal line DSL2 thereon. The first control signal line CSL1 may connect the first control signal pad CPa1 of the first chip region RC1 with the first control signal pad CPb1 of the second chip region RC2. The first data signal line DSL1 may connect the first data signal pad DPa1 of the first chip region RC1 with the data signal pad DPb of the second chip region RC2. The second data signal line DSL2 may connect the second data signal pad DPa2 of the first chip region RC1 with the data signal pad DPc of the third chip region RC3. The second control signal line CSL2 may connect the second control signal pad CPa2 of the first chip region RC1 with the second control signal pad CPc2 of the third chip region RC3. In contrast, the second control signal pad CPb2 of the second chip region RC2 and the first control signal pad CPc1 of the third chip region RC3 may not be connected to (i.e., may be untethered to or otherwise free of) any signal line that is external to the respective first and second drive circuit chips DI1 and DI2.

The first control signal line CSL1 may transmit a data control signal output from the timing controller chip TC into the first drive circuit chip DI1. The first data signal line DSL1 may transmit an image data signal output from the timing controller chip TC into the first drive circuit chip DI1. The second control signal line CSL2 may transmit a data control signal output from the timing controller chip TC into the second drive circuit chip DI2. The second data signal line DSL2 may transmit an image data signal output from the timing controller chip TC into the second drive circuit chip DI2.

For example, the data control signals transmitted through the first and second control signal lines CSL1 and CSL2 may be a configurable setting value or a DFT setting value. In this case, TTL (transistor-to-transistor) signal transmission may be used to transmit the data control signals through the first and second control signal lines CSL1 and CSL2. High Speed Differential signal transmission may be used to transmit the image data signals through the first and second data signal lines DSL1 and DSL2.

As shown in FIGS. 4 and 5, the flexible printed circuit board 120 may include a base substrate BS, a first insulation layer IL1 on a top surface of the base substrate BS, and a second insulation layer IL2 on a bottom surface of the base substrate BS. The top surface of the base substrate BS may be adjacent to the first surface 120a of the flexible printed circuit board 120, and the bottom surface of the base substrate BS may be adjacent to the second surface 120b of the flexible printed circuit board 120. For example, the base substrate BS may be a flexible film substrate, and each of the first and second insulation layers IL1 and IL2 may be a solder resist.

The top surface of the base substrate BS may include a plurality of the signal lines SL1 to SL11, CSL1, CSL2, DSL1, and DSL2 discussed above thereon. The signal lines SL1 to SL11, CSL1, CSL2, DSL1, and DSL2 may constitute/provide a single routing layer on the base substrate BS. In other words, the signal lines SL1 to SL11, CSL1, CSL2, DSL1, and DSL2 may be positioned at the same vertical level (see FIGS. 4 and 5) and horizontally spaced apart from each other (see FIG. 3). In this configuration, the signal lines SL1 to SL11, CSL1, CSL2, DSL1, and DSL2 may not cross each other even being positioned at the same vertical level. For example, the signal lines SL1 to SL11, CSL1, CSL2, DSL1, and DSL2 may be formed by printing a conductive layer on the top surface of the base substrate BS. The first insulation layer IL1 may cover the signal lines SL1 to SL11, CSL1, CSL2, DSL1, and DSL2.

The signal pads SPa1, CPa1, CPa2, DPa1, and DPa2 of the first chip region RC1, the signal pads SPb1 to SPb4, CPb1, CPb2, and DPb of the second chip region RC2, and the signal pads SPc1 to SPc4, CPc1, CPc2, and DPc of the third chip region RC3 may be disposed on correspondingly connected signal lines SL2 to SL10, CSL1, CSL2, DSL1, and DSL2. The signal pads may protrude above the first insulation layer IL1.

As shown in FIG. 4, the timing controller chip TC on the first chip region RC1 may include a first substrate 140 having a first active region 143, a first routing layer IML1 on the first active region 143, and bonding pads BP on the first routing layer IML1. The first active region 143 may include a plurality of transistors formed on the first substrate 140, which may be a semiconductor substrate. The first routing layer IML1 may include interlayer dielectric layers, metal lines formed in each of the interlayer dielectric layers, and vias formed in each of the interlayer dielectric layers. The bonding pads BP may be electrically connected through the first routing layer IML1 to the first active region 143.

The bonding pads BP of the timing controller chip TC may vertically overlap the signal pads SPa1, CPa1, CPa2, DPa1, and DPa2 of the first chip region RC1. Interconnect members IM may be interposed between and connect the bonding pads BP of the timing controller chip TC and the signal pads SPa1, CPa1, CPa2, DPa1, and DPa2 of the first chip region RC1. For example, each of the interconnect members IM may include a bump (e.g., a solder bump).

The first routing layer IML1 may electrically connect the bonding pad BP overlapping the first control signal pad CPa1 with the bonding pad BP overlapping the second control signal pad CPa2. That is, the first routing layer IML1 may electrically connect the first and second control signal pads CPa1 and CPa2 with each other that are the same kind/type of signal pad. Accordingly, there may be no need to further dispose on the flexible printed circuit board 120 a signal line for connecting the first control signal line CSL1 with the second control signal line CSL2. The first routing layer IML1 may electrically connect the bonding pad BP overlapping the first data signal pad DPa1 with the bonding pad BP overlapping the second data signal pad DPa2. That is, the first routing layer IML1 may electrically connect the first and second data signal pads DPa1 and DPa2 with each other that are the same kind/type of signal pad. Accordingly, there may be no need to further dispose on the flexible printed circuit board 120 a signal line for connecting the first data signal line DSL1 with the second data signal line DSL2.

As shown in FIG. 5, the first drive circuit chip DI1 on the second chip region RC2 may include a second substrate 150 having a second active region 153, a second routing layer IML2 on the second active region 153, and bonding pads BP on the second routing layer IML2. The second active region 153 may include a plurality of transistors formed on the second substrate 150, which is a semiconductor substrate. The second routing layer IML2 may include interlayer dielectric layers, metal lines formed in each of the interlayer dielectric layers, and vias formed in each of the interlayer dielectric layers. The bonding pads BP may be electrically connected through the second routing layer IML2 to the second active region 153.

The bonding pads BP of the first drive circuit chip DI1 may vertically overlap the signal pads SPb1 to SPb4, CPb1, CPb2, and DPb of the second chip region RC2. Interconnect members IM may be interposed between and connect the bonding pads BP of the first drive circuit chip DI1 and the signal pads SPb1 to SPb4, CPb1, CPb2, and DPb of the second chip region RC2.

The second routing layer IML2 may electrically connect the bonding pad BP overlapping the first control signal pad CPb1 with the bonding pad BP overlapping the second control signal pad CPb2. Therefore, although the first control signal line CSL1 is directly connected to only one of the first and second control signal pads CPb1 and CPb2, the first drive circuit chip DI1 may operate normally. In some embodiments, the first control signal line CSL1 may transmit a signal into the first drive circuit chip DI1 through the first control signal pad CPb1. The second control signal pad CPb2 may not be connected to (e.g., may be untethered to or otherwise free of) any signal line that is external to the first drive circuit chip DI1.

The second drive circuit chip DI2 on the third chip region RC3 may be the same as (e.g., a duplicate of) the first drive circuit chip DI1 discussed above. A detailed description of the second drive circuit chip DI2 may thus be omitted. The second drive circuit chip DI2 may also operate normally even though the second control signal line CSL2 is directly connected to only one of the first and second control signal pads CPc1 and CPc2. Unlike the first control signal line CSL1 connected to the first drive circuit chip DI1 discussed above, the second control signal line CSL2 may transmit a signal into the second drive circuit chip DI2 through the second control signal pad CPc2. The first control signal pad CPc1 may not be connected to (e.g., may be free of) any signal line that is external to the second drive circuit chip DI2.

According to example embodiments of present inventive concepts, each of the second and third chip regions RC2 and RC3 may include two control signal pads and one data signal pad thereon. Alternatively, in some embodiments, each of the second and third chip regions RC2 and RC3 may include one control signal pad and two data signal pads thereon. In this case, one data signal line may be connected to a first data signal pad of the second chip region RC2, and another data signal line may be connected to a second data signal pad of the third chip region RC3.

Figure 6:
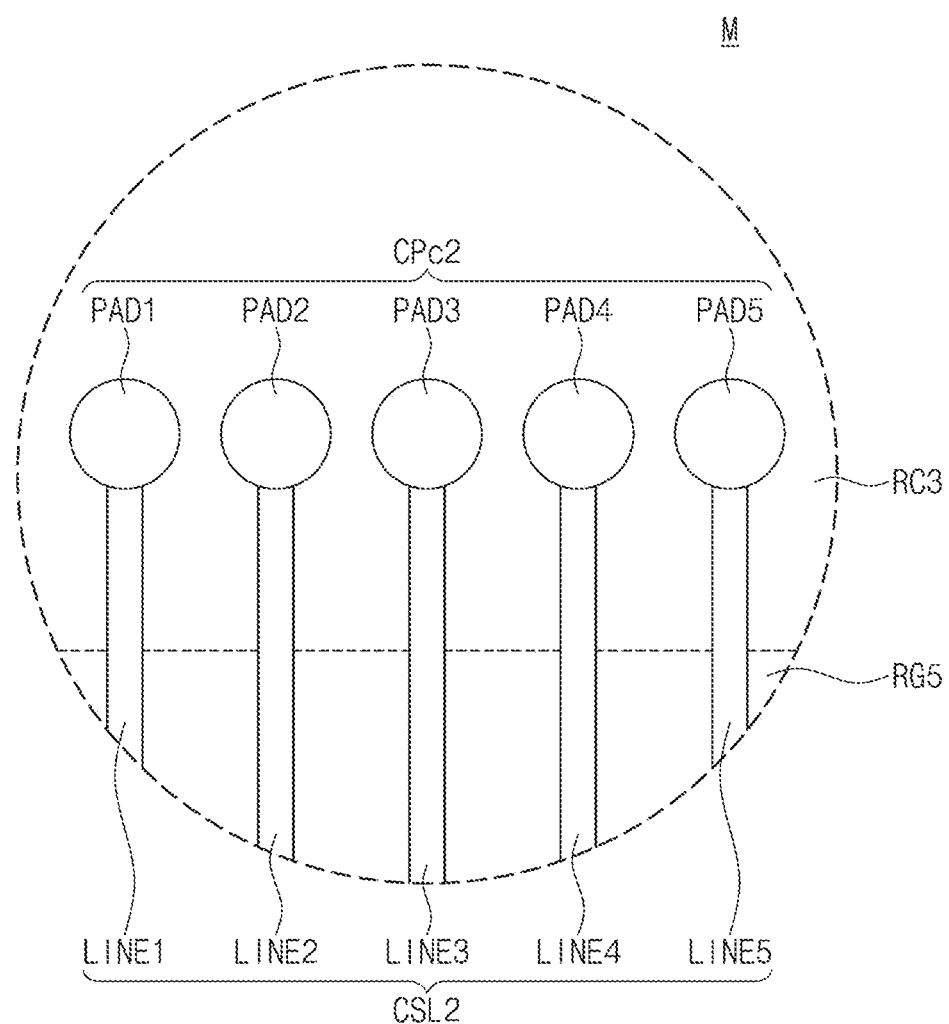
FIG. 6 is an enlarged plan view illustrating section M of FIG. 3 according to example embodiments of present inventive concepts.

FIG. 6 is an enlarged plan view illustrating section M of FIG. 3 according to example embodiments of present inventive concepts.

Referring to FIGS. 3 and 6, each of the signal lines SL1 to SL11, CSL1, CSL2, DSL1, and DSL2 may be composed of a single conductive line or a conductive line group including a plurality of conductive lines. For example, the second control signal line CSL2 may include a plurality of conductive lines LINE1 to LINE5. In this case, the conductive lines LINE1 to LINE5 may be adjacently disposed to constitute a single group (i.e., the second control signal line CSL2).

Each of the signal pads SPa1, CPa1, CPa2, DPa1, DPa2, SPb1 to SPb4, CPb1, CPb2, DPb, SPc1 to SPc4, CPc1, CPc2, and DPc may be composed of a single pad or a pad group including a plurality of pads. Each of the signal pads SPa1, CPa1, CPa2, DPa1, DPa2, SPb1 to SPb4, CPb1, CPb2, DPb, SPc1 to SPc4, CPc1, CPc2, and DPc may include pads corresponding to conductive lines of its connected signal line. For example, the second control signal pad CPc2 connected to the second control signal line CSL2 may include a plurality of pads PAD1 to PAD5 corresponding to the conductive lines LINE1 to LINE5, respectively.

Accordingly, example embodiments of present inventive concepts are not limited to the numbers (i.e., quantities) of the signal lines and the signal pads shown in FIG. 3, and the illustrated signal lines and pads are shown for purposes of example.

Figure 7:
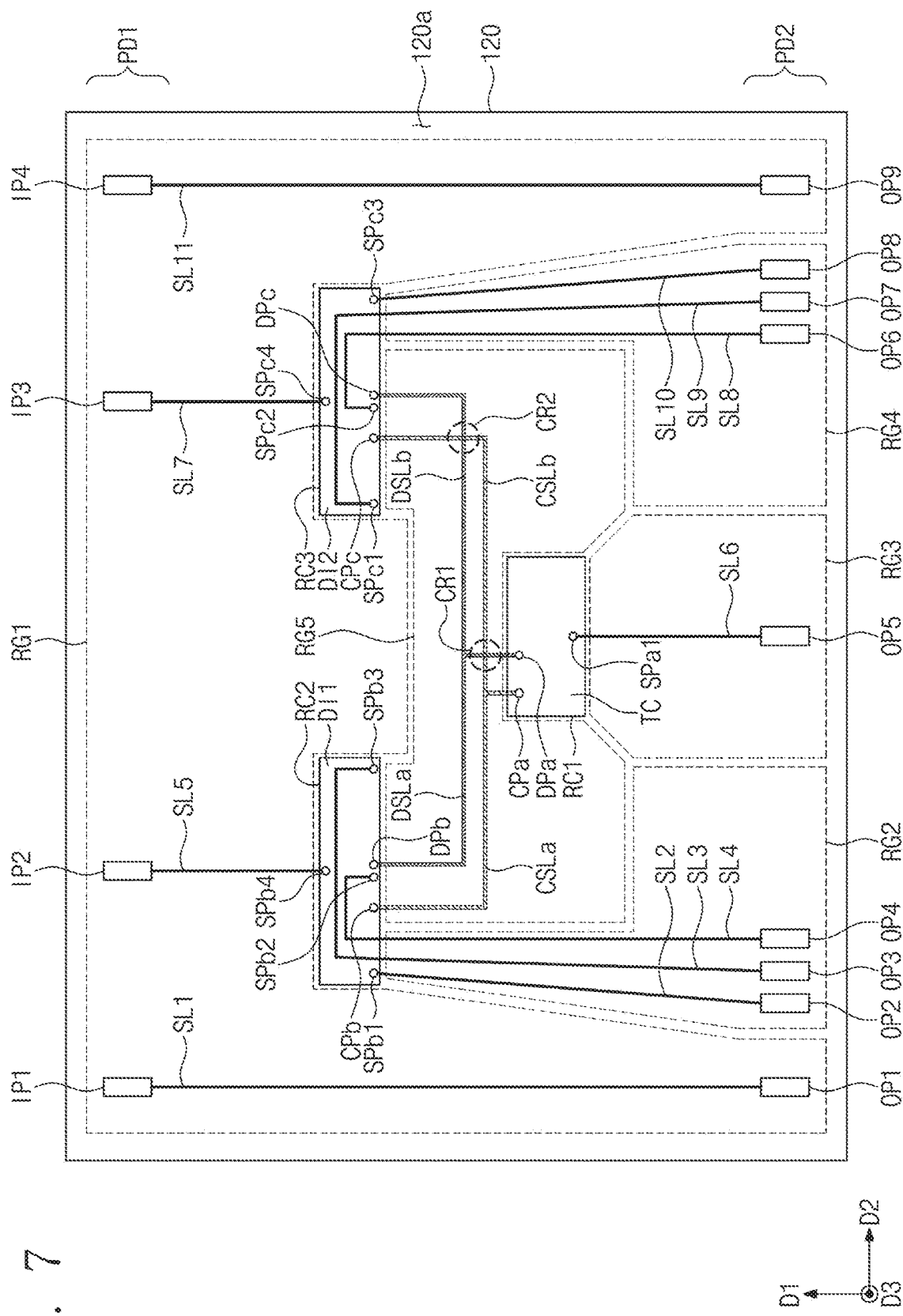
FIG. 7 is a plan view illustrating a timing controller chip, a first drive circuit chip, and a second drive circuit chip mounted on a flexible printed circuit board according to a comparative example.

FIG. 7 is a plan view illustrating a timing controller chip, a first drive circuit chip, and a second drive circuit chip mounted on a flexible printed circuit board according to a comparative example. In the comparative example that follows, a detailed description of technical features repetitive to those discussed with reference to FIGS. 3 to 5 will be omitted and difference may be discussed in detail.

Referring to FIG. 7, the first surface 120a of the first chip region RC1 may include a control signal pad CPa, a data signal pad DPa, and a signal pad SPa1 thereon. Differently from the first chip region RC1 shown above in FIGS. 3, 4, and 5, the second control signal pad CPa2 and the second data signal pad DPa2 may be omitted.

The first surface 120a of the second chip region RC2 may include a control signal pad CPb, a data signal pad DPb, and first to fourth signal pads SPb1 to SPb4 thereon. Differently from the second chip region RC2 shown above in FIGS. 3, 4, and 5, the second control signal pad CPb2 may be omitted. The first surface 120a of the third chip region RC3 may include a control signal pad CPc, a data signal pad DPc, and first to fourth signal pads SPc1 to SPc4 thereon. Differently from the third chip region RC3 shown above in FIGS. 3, 4, and 5, the second control signal pad CPc2 may be omitted.

The first surface 120a of the fifth region RG5 may include a control signal line CSLa/CSLb and a data signal line DSLa/DSLb thereon. The control signal line CSLa/CSLb may connect the control signal pad CPa of the first chip region RC1 with the control signal pads CPb and CPc of the second and third chip regions RC2 and RC3, respectively. The control signal line CSLa/CSLb may include a first section CSLa and a second section CSLb. The first and second sections CSLa and CSLb may extend in the first direction D1, so that the first section CSLa may be connected to the control signal pad CPb of the second chip region RC2, and the second section CSLb may be connected to the control signal pad CPc of the third chip region RC3.

The data signal line DSLa/DSLb may connect the data signal pad DPa of the first chip region RC1 with the data signal pads DPb and DPc of the second and third chip regions RC2 and RC3, respectively. The data signal line DSLa/DSLb may include a first section DSLa and a second section DSLb. The first and second sections DSLa and DSLb may extend in the first direction D1, so that the first section DSLa may be connected to the data signal pad DPb of the second chip region RC2, and the second section DSLb may be connected to the data signal pad DPc of the third chip region RC3.

The control signal line CSLa/CSLb may cross the data signal line DSLa/DSLb. In detail, the control signal line CSLa/CSLb and the data signal line DSLa/DSLb may cross at first and second cross points CR1 and CR2.

If the signal lines SL1 to SL11, CSL1, CSL2, DSL1, and DSL2 constitute a single routing layer on the base substrate BS as discussed above with reference to FIGS. 4 and 5, an electrical short may occur between the data signal line CSLa/CSLb and the data signal line DSLa/DSLb such that the timing controller chip TC and the first and second drive circuit chips DI1 and DI2 may not operate normally. According to the comparative example, the signal lines SL1 to SL11, CSL1, CSL2, DSL1, and DSL2 may be disposed in a plurality of routing layers. For example, it is necessary that the control signal line CSLa/CSLb be disposed at a different vertical level from that of the data signal line DSLa/DSLb. There may, however, be problems with this case that a fabrication process becomes complicated and a manufacturing cost increases.

According to example embodiments of present inventive concepts discussed above with FIGS. 3, 4, and 5, two control signal pads may be disposed on each of the second and third chip regions RC2 and RC3. A routing layer of each of the first and second drive circuit chips DI1 and DI2 may electrically connect the two control signal pads with each other. As such, an entire device may normally operate even though a control signal line is connected to only one (e.g., either one) of the two control signal pads, and thereby routing freedom may increase. Moreover, the first chip region RC1 may include the first and second control signal pads CPa1 and CPa2 mutually electrically connected through the first routing layer IML1 of the timing controller chip TC and with the first and second data signal pads DPa1 and DPa2 mutually electrically connected through the first routing layer IML1 of the timing controller chip TC thereon. The signal lines CSL1, CSL2, DSL1 and DSL2, which are respectively connected to the signal pads CPa1, CPa2, DPa1 and DPa2, may be connected to the first and second drive circuit chips DI1 and DI2 while being positioned at the same vertical level without crossing each other.

Figure 8:
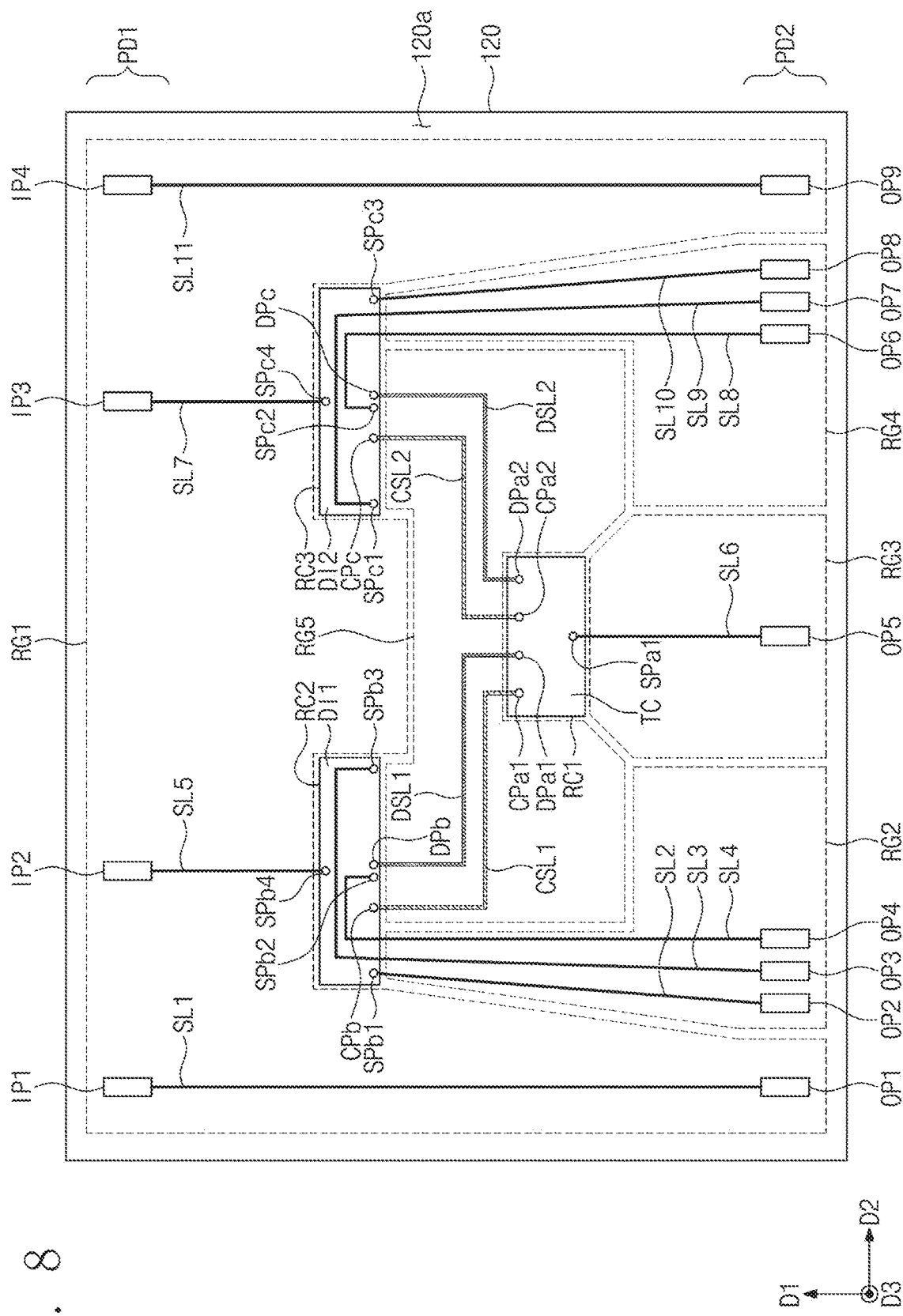
FIG. 8 is a plan view illustrating a timing controller chip, a first drive circuit chip, and a second drive circuit chip mounted on a flexible printed circuit board according to example embodiments of present inventive concepts.

FIG. 8 is a plan view illustrating a timing controller chip, a first drive circuit chip, and a second drive circuit chip mounted on a flexible printed circuit board according to example embodiments of present inventive concepts. In the example that follows, a detailed description of technical features repetitive with respect to those discussed with reference to FIGS. 3 to 5 may be omitted and differences may be discussed in detail.

Referring to FIG. 8, the first surface 120a of the first chip region RC1 may include first and second control signal pads CPa1 and CPa2 and first and second data signal pads DPa1 and DPa2 thereon, all of which may be arranged in the second direction D2. Differently from the first chip region RC1 shown above in FIGS. 3, 4, and 5, one of the first and second data signal pads DPa1 and DPa2 may be positioned between the first and second control signal pads CPa1 and CPa2, and one of the first and second control signal pads CPa1 and CPa2 may be positioned between the first and second data signal pads DPa1 and DPa2. That is, the first and second control signal pads CPa1 and CPa2 may be arranged alternately with the first and second data signal pads DPa1 and DPa2. In detail, the first data signal pad DPa1 may be positioned between the first and second control signal pads CPa1 and CPa2, and the second control signal pad CPa2 may be positioned between the first and second data signal pads DPa1 and DPa2.

The first surface 120a of the second chip region RC2 may include a control signal pad CPb, a data signal pad DPb, and first to fourth signal pads SPb1 to SPb4 thereon. Differently from the second chip region RC2 shown above in FIGS. 3, 4, and 5, the second control signal pad CPb2 may be omitted. The first surface 120a of the third chip region RC3 may include a control signal pad CPc, a data signal pad DPc, and first to fourth signal pads SPc1 to SPc4 thereon. Differently from the third chip region RC3 shown above in FIGS. 3, 4, and 5, the second control signal pad CPc2 may be omitted.

On the fifth region RG5, the first control signal line CSL1 may connect the first control signal pad CPa1 of the first chip region RC1 with the control signal pad CPb of the second chip region RC2. The first data signal line DSL1 may connect the first data signal pad DPa1 of the first chip region RC1 with the data signal pad DPb of the second chip region RC2. The second control signal line CSL2 may connect the second control signal pad CPa2 of the first chip region RC1 with the control signal pad CPc of the third chip region RC3. The second data signal line DSL2 may connect the second data signal pad DPa2 of the first chip region RC1 with the data signal pad DPc of the third chip region RC3.

In some embodiments, differently from the second and third chip regions RC2 and RC3 discussed above with reference to FIGS. 3, 4, and 5, each of the second and third chip regions RC2 and RC3 may include only one control signal pad and only one data signal pad. However, on first chip region RC1, the first and second control signal pads CPa1 and CPa2 may be arranged alternately with the first and second data signal pads DPa1 and DPa2, so that the signal lines CSL1, CSL2, DSL1, and DSL2 may connect the timing controller chip TC with the first and second drive circuit chips DI1 and DI2 while not crossing each other.

As used herein, the words "controller" and "timing controller" may refer to the timing controller chip TC. Also, the words "drive circuits" may refer to the drive circuit chips DI1 and DI2, which may be identical Display Driver Integrated circuits (DDIs) that are spaced apart from each other on the same flexible film substrate. Moreover, because the signal lines CSL1, CSL2, DSL1, and DSL2 do not cross each other and are in only one layer, they may be referred to herein as "a single layer of non-overlapping signal lines." Respective uppermost surfaces (surfaces farthest from the first surface 120a of the flexible printed circuit board 120) of the signal lines CSL1, CSL2, DSL1, and DSL2 may thus be coplanar.

To help confine the signal lines that extend between the controller and the DDIs to a single layer of non-overlapping signal lines, the DDIs may include embedded routing lines. For example, a first pad (e.g., the pad CPb1 of the drive circuit chip DI1) that is connected to the signal line CSL1 may be connected by an embedded routing line in the drive circuit chip DI1 to a second pad (e.g., the pad CPb2 of the drive circuit chip DI1) that is spaced apart from the signal line CSL1.

In a semiconductor device according to various embodiments of present inventive concepts, a printed circuit board may include thereon signal lines that connect a timing controller chip with first and second drive circuit chips. In this configuration, the signal lines may be positioned at the same vertical level without crossing each other.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:
1. A semiconductor device, comprising:
a base substrate;
a timing controller chip on the base substrate;
first and second drive circuit chips on the base substrate; and a plurality of signal lines on the base substrate, the plurality of signal lines being positioned at a same vertical level and horizontally spaced apart from each other, wherein the plurality of signal lines comprise:
a first data signal line and a first control signal line that electrically connect the timing controller chip with the first drive circuit chip; and
a second data signal line and a second control signal line that electrically connect the timing controller chip with the second drive circuit chip.

2. The semiconductor device of claim 1, wherein:
the first data signal line is configured to transmit a first data signal between the timing controller chip and the first drive circuit chip,
the first control signal line is configured to transmit a first control signal between the timing controller chip and the first drive circuit chip,
the second data signal line is configured to transmit a second data signal between the timing controller chip and the second drive circuit chip, and
the second control signal line is configured to transmit a second control signal between the timing controller chip and the second drive circuit chip.

3. The semiconductor device of claim 1, wherein the first drive circuit chip comprises a display driver chip that is identical to the second drive circuit chip.

4. The semiconductor device of claim 1, further comprising a first data signal pad, a second data signal pad, a first control signal pad, and a second control signal pad that are between the base substrate and the timing controller chip,
wherein the first data signal pad, the second data signal pad, the first control signal pad, and the second control signal pad are respectively connected to the first data signal line, the second data signal line, the first control signal line, and the second control signal line.

5. The semiconductor device of claim 4,
wherein the timing controller chip comprises a substrate and a routing layer on the substrate, and
wherein the routing layer connects the first and second data signal pads with each other and also connects the first and second control signal pads with each other.

6. The semiconductor device of claim 4,
wherein one of the first and second data signal pads is positioned between the first and second control signal pads, and
wherein one of the first and second control signal pads is positioned between the first and second data signal pads.

7. The semiconductor device of claim 1, further comprising:
a first control signal pad and a second control signal pad that are on a first chip region comprising the first drive circuit chip; and
a third control signal pad and a fourth control signal pad that are on a second chip region comprising the second drive circuit chip, wherein:
a position of the first control signal pad relative to the first chip region is identical to a position of the third control signal pad relative to the second chip region,
a position of the second control signal pad relative to the first chip region is identical to a position of the fourth control signal pad relative to the second chip region,
the first control signal line is electrically connected to the first control signal pad, and the second control signal line is electrically connected to the fourth control signal pad.

8. The semiconductor device of claim 7, wherein:
the first drive circuit chip comprises a first substrate and a first routing layer on the first substrate,
the second drive circuit chip comprises a second substrate and a second routing layer on the second substrate,
the first routing layer connects the first and second control signal pads with each other, and
the second routing layer connects the third and fourth control signal pads with each other.

9. The semiconductor device of claim 1, wherein the base substrate is a flexible substrate.

10. The semiconductor device of claim 1, wherein each of the first and second data signal lines and the first and second control signal lines comprises at least one conductive line.

11. A semiconductor device comprising:
a base substrate;
a timing controller chip on the base substrate;
first and second drive circuit chips on the base substrate; and
a plurality of signal lines on the base substrate, the plurality of signal lines being positioned at a same vertical level and horizontally spaced apart from each other,
wherein the plurality of signal lines comprise:
a first plurality of signal lines that electrically connect the timing controller chip with the first drive circuit chip; and
a second plurality of signal lines that electrically connect the timing controller chip with the second drive circuit chip, and
wherein the first drive circuit chip comprises a display driver chip that is identical to the second drive circuit chip.

12. The semiconductor device of claim 11,
wherein the first plurality of signal lines comprise a control signal line, and
wherein the second plurality of signal lines comprise a data signal line.

13. A semiconductor device comprising:
a base substrate;
a timing controller chip on the base substrate;
first and second drive circuit chips on the base substrate; and
a single routing layer comprising a plurality of signal lines on the base substrate, the plurality of signal lines being positioned at a same vertical level and horizontally spaced apart from each other,
wherein the plurality of signal lines comprise:
a first data signal line and a first control signal line that electrically connect the timing controller chip with the first drive circuit chip; and
a second data signal line and a second control signal line that electrically connect the timing controller chip with the second drive circuit chip.

14. The semiconductor device of claim 13, further comprising a first data signal pad, a second data signal pad, a first control signal pad, and a second control signal pad that are between the base substrate and the timing controller chip,
wherein the first data signal pad, the second data signal pad, the first control signal pad, and the second control signal pad are respectively connected to the first data signal line, the second data signal line, the first control signal line, and the second control signal line.

15. The semiconductor device of claim 14,
wherein the timing controller chip comprises a substrate and a routing layer on the substrate, and
wherein the routing layer connects the first and second data signal pads with each other and also connects the first and second control signal pads with each other.

16. The semiconductor device of claim 14,
wherein one of the first and second data signal pads is positioned between the first and second control signal pads, and
wherein one of the first and second control signal pads is positioned between the first and second data signal pads.

17. The semiconductor device of claim 13, further comprising:
- a first control signal pad and a second control signal pad that are on a first chip region comprising the first drive circuit chip; and
- a third control signal pad and a fourth control signal pad that are on a second chip region comprising the second drive circuit chip, wherein:
  - a position of the first control signal pad relative to the first chip region is identical to a position of the third control signal pad relative to the second chip region,
  - a position of the second control signal pad relative to the first chip region is identical to a position of the fourth control signal pad relative to the second chip region,
  - the first control signal line is electrically connected to the first control signal pad, and
  - the second control signal line is electrically connected to the fourth control signal pad.

18. The semiconductor device of claim 17, wherein:
the first drive circuit chip comprises a first substrate and a first routing layer on the first substrate,
the second drive circuit chip comprises a second substrate and a second routing layer on the second substrate,
the first routing layer connects the first and second control signal pads with each other, and
the second routing layer connects the third and fourth control signal pads with each other.

19. The semiconductor device of claim 13, wherein the base substrate is a flexible substrate.

20. The semiconductor device of claim 2,
wherein the first data signal comprises image data, and
wherein the first control signal comprises a setting value.

* * * * *